United States Patent [19]

Ichikawa et al.

[11] Patent Number: 5,757,250
[45] Date of Patent: May 26, 1998

[54] SURFACE ACOUSTIC WAVE MODULE WITH THIN FILM FOR WAVE TRANSMISSION VELOCITY DIFFERENTIATION

[75] Inventors: Yo Ichikawa; Hideaki Adachi; Kentaro Setsune, all of Osaka; Syunichiro Kawashima, Kyoto, all of Japan

[73] Assignee: Matsushita Electric Industrial Co., Ltd., Osaka, Japan

[21] Appl. No.: 795,485

[22] Filed: Feb. 11, 1997

Related U.S. Application Data

[62] Division of Ser. No. 555,744, Nov. 9, 1995.

[30] Foreign Application Priority Data

Mar. 6, 1995 [JP] Japan ..................... 7-045187
May 11, 1995 [JP] Japan ..................... 7-112756

[51] Int. Cl.⁶ .................................. H03H 9/25
[52] U.S. Cl. ......................... 333/193; 310/313 A
[58] Field of Search ..................... 333/193–196; 310/313 R, 313 B, 313 C, 313 D, 313 A

[56] References Cited

U.S. PATENT DOCUMENTS

| | | | |
|---|---|---|---|
| 3,766,616 | 10/1973 | Staudte | 29/25.35 |
| 4,672,254 | 6/1987 | Dolat et al. | 310/313 R |
| 4,933,588 | 6/1990 | Greer | 310/313 D |
| 5,298,333 | 3/1994 | Maixner et al. | 428/472 |
| 5,343,107 | 8/1994 | Shikata et al. | 310/313 A |

FOREIGN PATENT DOCUMENTS

| | | |
|---|---|---|
| 0 407 163 | 1/1991 | European Pat. Off. |
| 0 517 239 | 12/1992 | European Pat. Off. |
| 0 534 252 A1 | 3/1993 | European Pat. Off. ........ 310/313 A |
| 26 31 671 | 2/1977 | Germany |
| 54-51390 | 4/1979 | Japan ........ 333/193 |
| 56-31213 | 3/1981 | Japan ........ 310/313 A |
| 59-210708 | 11/1984 | Japan |
| 61-63103 | 4/1986 | Japan ........ 333/195 |

OTHER PUBLICATIONS

*CRC Handbook of Chemistry and Physics*; David R. Lide, Ph.D., editor; 71ˢᵗ Edition, 1990; CRC Press, Inc.; pp. 1–10, 1990

Greer, et al., "Applications of Laser-Trimming For All Quartz Package, Surface Acoustic Wave Devices", 1989 Ultrasonics Symposium, Oct. 1989, Montreal, pp. 179–184.

*Primary Examiner*—Robert Pascal
*Assistant Examiner*—Barbara Summons
*Attorney, Agent, or Firm*—Merchant, Gould, Smith Edell, Welter & Schmidt, P.A.

[57] ABSTRACT

A surface acoustic module is stable, and its operation frequencies can be varied with high precision. A method of manufacturing the surface acoustic module prevents the module's electrodes from being broken during separation of a sheet of modules into individual components. The surface acoustic module includes electrodes for transmitting and receiving a surface acoustic wave, a surface acoustic wave transmitting substrate, a high resistance thin film, and a thin film for differentiating the transmission velocity of a surface acoustic wave at the high resistance thin film from that at the substrate. The method includes the steps of forming a metallic film on a sheet of the surface acoustic wave transmitting substrate, of forming the electrodes on the metallic film, and of irradiating light or the like to the metallic film so as to increase the film's resistivity.

16 Claims, 10 Drawing Sheets

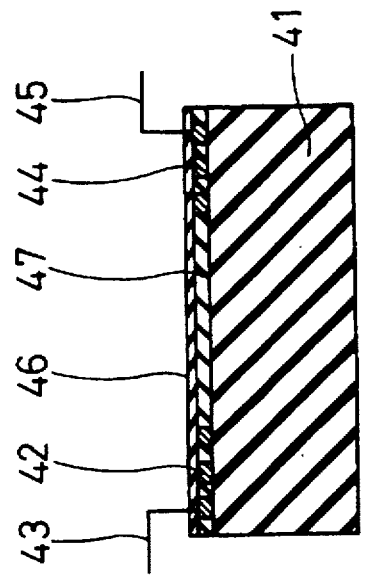
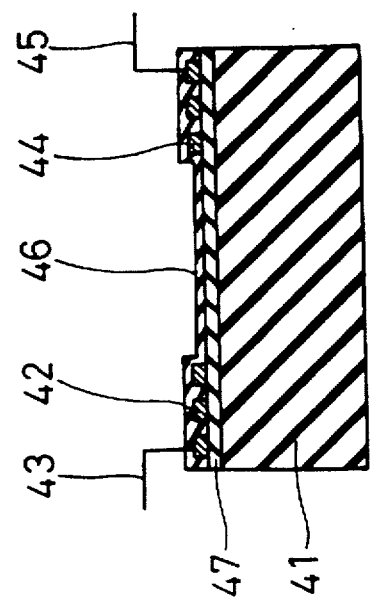

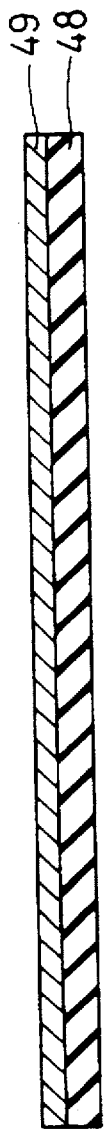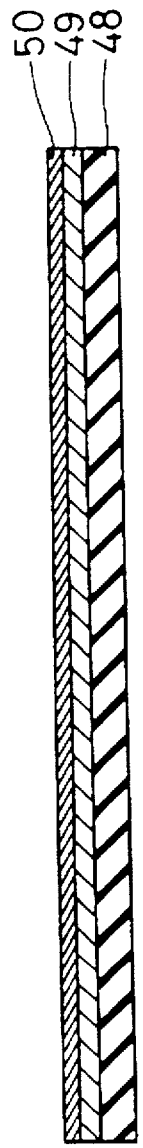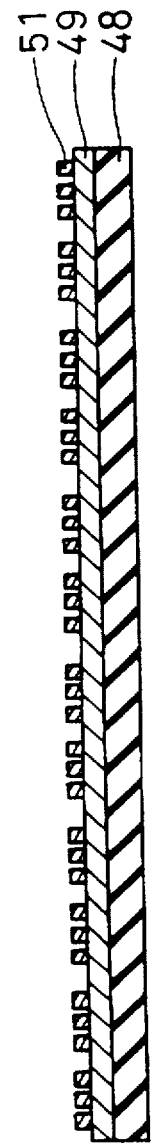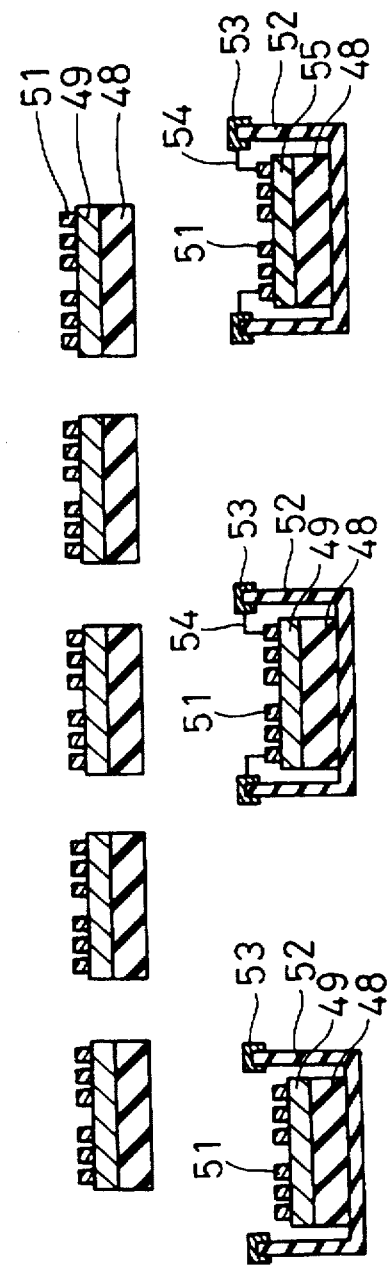
FIG.13A FIG.13B FIG.13C FIG.13D FIG.13E FIG.13F FIG.13G

FIG.14A
FIG.14B
FIG.14C
FIG.14D
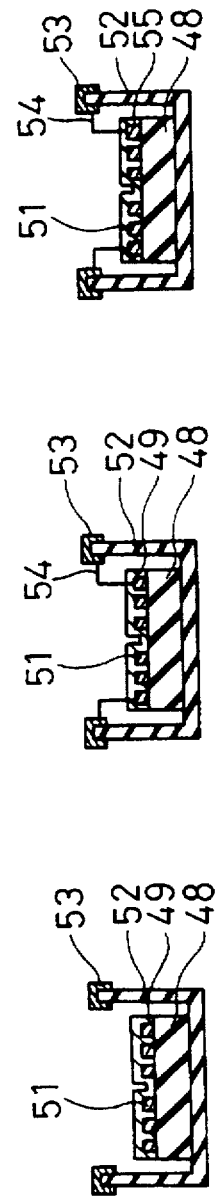
FIG.14E
FIG.14F
FIG.14G

SURFACE ACOUSTIC WAVE MODULE WITH THIN FILM FOR WAVE TRANSMISSION VELOCITY DIFFERENTIATION

This is a Divisional of application Ser. No. 08/555,744, filed Nov. 9, 1995, which application is incorporated herein by reference.

FIELD OF THE INVENTION

This invention relates to a surface acoustic wave module which is widely used for mobile communication devices, and further relates to a method of manufacturing the surface acoustic wave module.

BACKGROUND OF THE INVENTION

A frequency band of several dozen to several hundred MHz is applied to conventional mobile communication devices such as automobile radio transmission devices. However, a system operating with a 1.5 GHz or higher sub-microwave band is becoming mainstream, fulfilling the increasing demand for mobile communication devices. Surface acoustic wave (SAW) elements utilizing surface acoustic waves generated at a solid surface are applied mainly as filters to most mobile communication devices. The SAW element generally applies an electric wave to an inter-digital transducer fixed on the surface of a piezoelectric substrate, thus driving a surface acoustic wave to the surface of the substrate. Crystal having a surface acoustic wave with a large acoustic velocity is used as a substrate for the SAW filter found on the market, and an Al inter-digital transducer used for transmitting the surface acoustic wave is formed on the crystal substrate.

As a conventional frequency adjusting method for SAW filters, a silicon oxide (Si—O) thin film having a mismatching lattice configuration is formed on the substrate, and light is irradiated to the substrate so as to change the transmission velocity of the surface acoustic wave. This method is disclosed in Published examined (Tokkohei) Japanese Patent Application No. Hei 3-51128.

Operation frequencies for a surface acoustic wave module including SAW filters depend on the acoustic velocity of the surface acoustic wave of a piezoelectric body, and the configuration cycles of inter-digital transducers used for receiving and transmitting surface acoustic waves. For instance, cellular phones have a 12.5 kHz channel gap for a communication circuit, so that the operation frequencies of SAW filters are required to be highly precise. However, in conventional methods of manufacturing SAW filters, the precision of a film thickness (from several nm to 500 nm) and of a configuration cycle (from submicron to several μm) is only within 1%. It is difficult to tune 1.5 GHz frequency to ±12.5 kHz preferable frequency, and the yield of products manufactured through a strict quality control is 50–70%. A method for obtaining the operation frequency of SAW filters with minute variations is desired; the above-mentioned Published examined (Tokkohei) Japanese Patent Application No. Hei 3-51128 is not sufficient to satisfy this request.

Another problem is that the frequencies change greatly, namely, about several hundreds ppm/° C., so the device cannot be practical.

And in the step of manufacturing SAW elements, the operation frequency of the elements changes irregularly before and after the final step, namely, in the mounting of sealing window of the packaging. This is a serious problem that has not been solved yet.

Moreover, when a substrate having high pyroelectric properties such as $LiNbO_3$, $LiTaO_3$ and $Li_2B_4O_7$ is used for a SAW filter, the operation frequency changes after a 200°–300° C. temperature flow test and the transmission loss of the element increases. Another problem is also found in that a wafer used for the substrate is charged during a separation process (dicing process) after forming electrodes on a sheet so that a potential difference as well as sparks are generated between the electrodes, shunting a section between the electrodes.

SUMMARY OF THE INVENTION

It is an object of this invention to solve the above-mentioned conventional problems by providing a surface acoustic wave module having electrodes that cannot be broken during the separation process from a sheet and having a wide adjustment range for operation frequency and a stable operation frequency, and by providing a highly efficient method of manufacturing the surface acoustic wave module. In order to accomplish these objects, a surface acoustic wave module of the present invention includes electrodes for driving and receiving a surface acoustic wave, a substrate for transmitting the surface acoustic wave, and an oxide thin film including group IV-a elements, formed on at least one section of the substrate so as to differentiate the transmission velocity of the surface acoustic wave. The oxide thin film may have a crystal configuration and elements different from those of the substrate, and can be a microcrystalline thin film having a crystal section and/or an amorphous thin film having a crystal section. The oxide thin film can be 0.001–0.05λ thick, where λ indicates the wavelength of a surface acoustic wave. The oxide thin film can be treated after packaging operations so as to change the configuration of the crystal atoms of the thin film.

A second surface acoustic wave module of the present invention includes electrodes for transmitting and receiving a surface acoustic wave, a substrate for transmitting the surface acoustic wave, a high resistance thin film formed on at least one section of the substrate surface and a thin film formed on the high resistance thin film so as to differentiate the transmission velocity of the surface acoustic wave at the high resistance thin film from the velocity at the substrate. The high resistant thin film can have a resistivity of $10^3$ Ωcm or higher and a thickness of 1–100 nm. The high resistance thin film can include oxygen or nitrogen.

BRIEF DESCRIPTION OF THE DRAWINGS

FIGS. 12A and 12B are cross-sectional views of a surface acoustic wave filter of a fifth embodiment of the invention.

FIGS. 13A, 13B, 13C, 13D, 13E, 13F and 13G are schematic views of a surface acoustic wave filter of the sixth embodiment of the invention, showing the manufacturing processes of the filter.

FIGS. 14A, 14B, 14C, 14D, 14E, 14F and 14G are schematic views of a surface acoustic wave filter of a seventh embodiment of the invention, showing the manufacturing processes of the filter.

DETAILED DESCRIPTION OF THE INVENTION

Figure 1:
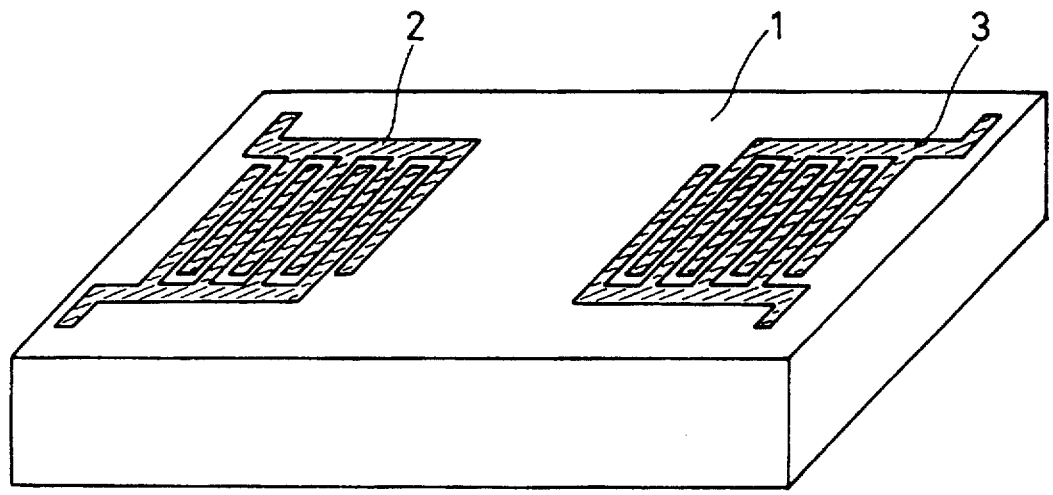
FIG. 1 is a schematic view of a conventional SAW filter.

This invention will be described by referring to the following illustrative examples and attached figures.

The first surface acoustic wave module of the invention includes electrodes for driving and receiving a surface acoustic wave, a substrate for transmitting the surface acoustic wave, and an oxide thin film including group IV-a elements, formed on at least one section of the substrate so as to differentiate the transmission velocity of the surface acoustic wave.

It is preferable that the oxide thin film including group IV-a elements has a crystal configuration and elements different from those of the substrate.

It is also preferable that the oxide thin film including group IV-a elements is at least one thin film selected from the group consisting of a Ti—O thin film and a Zr—O thin film.

It is further preferable that the oxide thin film including group IV-a elements is accumulated or coated on the substrate.

It is preferable that the substrate is a crystal substrate, and that the thin film is a microcrystalline thin film having a crystal section and/or an amorphous thin film having a crystal section.

It is also preferable that the oxide thin film including group IV-a elements is an insulator.

It is further preferable that the oxide thin film including group IV-a elements is formed on one section of the substrate surface.

It is preferable that the oxide thin film including group IV-a elements is 0.001–0.05λ thick (where λ indicates the wavelength of a surface acoustic wave).

It is also preferable that the substrate is at least one piezoelectric substrate selected from the group consisting of quartz, LiTaO$_3$, LiNbO$_3$, Li$_2$B$_4$O$_7$, ZnO, AlN, Ta$_2$O$_5$, Pb—Nb—Ti—Mn—In—O and Pb—Zn—Ti—O.

The first method of manufacturing a surface acoustic wave module of the invention includes the steps comprising:
forming an oxide thin film on a surface acoustic wave transmitting substrate and forming electrodes for driving and receiving a surface acoustic wave thereon; or
forming electrodes for driving and receiving a surface acoustic wave on a surface acoustic wave transmitting substrate and forming an oxide thin film thereon; and
conducting packaging and then treatment so as to change the configuration of crystal atoms of the thin film.

It is preferable that the configuration of crystal atoms of the thin films is changed by forming electrodes for driving and receiving a surface acoustic wave on the surface acoustic wave transmitting substrate, and forming an oxide thin film comprising group IV-a elements on the electrodes.

It is also preferable that the crystal atom configuration is changed by at least one means selected from the group consisting of light irradiation, heat ray irradiation and electromagnetic wave irradiation.

It is also preferable that a holder for a surface acoustic wave module element mounting is further attached.

It is also preferable that the holder for a surface acoustic wave module element mounting comprises materials which pass at least light, heat rays or electromagnetic waves.

It is further preferable that the crystal atom configuration of the thin film is changed after packaging the surface acoustic wave module.

The second surface acoustic wave module of the invention includes electrodes for transmitting and receiving a surface acoustic wave, a substrate for transmitting the surface acoustic wave, a high resistance thin film formed on at least one section of the substrate surface, and a thin film formed on the high resistance thin film so as to differentiate the transmission velocity of the surface acoustic wave at the high resistance thin film from the velocity at the substrate.

It is preferable that the high resistance thin film has a resistivity of 10$^3$ Ωcm or higher.

It is also preferable that the high resistance thin film is 1–100 nm thick.

It is further preferable that the high resistance thin film is a compound thin film including at least oxygen.

It is preferable that the high resistance thin film is a compound thin film including at least nitrogen.

It is also preferable that the high resistance thin film is an oxide thin film including an oxide of at least one element selected from the group consisting of titanium (Ti), aluminum (Al), silicon (Si) and lithium (Li). An oxide thin film including the oxide of an element such as Ga, In, Tl, Ge, Sn, Pb, Zr, Sc, Y, lanthanum based elements, Nb and Ta can also be applied as the high resistance thin film.

It is further preferable that the high resistance thin film is a nitride thin film including the nitride of aluminum (Al), silicon (Si) or boron (B).

It is preferable that the thin film formed on the high resistance thin film so as to differentiate the transmission velocity is an oxide thin film or a nitride thin film.

It is also preferable that the substrate is at least one piezoelectric substrate selected from the group consisting of LiTaO$_3$, LiNbO$_3$, and Li$_2$B$_4$O$_7$.

The second method of manufacturing a surface acoustic wave module of the invention includes the steps of forming a conductive metallic film on a sheet of a surface acoustic wave transmitting substrate, of forming electrodes for driving and receiving a surface acoustic wave, of separating the sheet into individual units, and of treating the conductive metallic film so as to increase its resistivity to at least 10$^3$ Ωcm.

The third method of manufacturing a surface acoustic wave module of the invention includes the steps of forming electrodes for driving and receiving a surface acoustic wave on a sheet of a surface acoustic wave transmitting substrate, of forming a conductive metallic film on the electrodes and the substrate, of separating the sheet into individual units, and of treating the metallic film so as to increase its resistivity to at least $10^3$ $\Omega$cm.

It is preferable that the metallic film is 1–100 nm thick.

It is also preferable that the metallic film is made of a metal or an alloy of metals selected from the group consisting of titanium (Ti), aluminum (Al), silicon (Si), boron (B) and lithium (Li).

It is also preferable that the substrate is at least one piezoelectric substrate selected from the group consisting of $LiTaO_3$, $LiNbO_3$ and $Li_2B_4O_7$.

It is further preferable that the metallic film is treated with an oxidizing treatment or a nitriding treatment so as to increase its resistivity.

The first surface acoustic wave module has a wide adjustment range for operation frequency and a stable operation frequency. More specifically, by forming a section having a different piezoelectric constant, solid density and the like from those of the substrate, the transmission velocity of a surface acoustic wave at the oxide thin film is differentiated from the velocity at the substrate, thus changing the operation frequency.

The operation frequency of the first surface acoustic wave module can be changed more efficiently when the oxide thin film including group IV-a elements has a different crystal configuration or elements from those of the substrate.

If the oxide thin film including group IV-a elements is at least one thin film selected from Ti—O and Zr—O, the operation frequency of the first surface acoustic wave module would be more efficiently changed.

When the oxide thin film including group IV-a elements is a thin film laminated or coated on the substrate, the thin film is thin enough to efficiently change the operation frequency of the first surface acoustic wave module.

The operation frequency of the first surface acoustic wave module would be efficiently changed if the substrate is a crystal substrate and the thin film is a microcrystal thin film including a crystal section and/or an amorphous thin film.

The oxide thin film including group IV-a elements is an insulator, so that the electrodes are directly in contact with the thin film.

When the oxide thin film including group IV-a elements is formed as a part of the surface of the substrate, the first surface acoustic wave module includes the substrate in one body. As a part of the substrate surface, the oxide thin film is formed on the substrate or formed partially in the substrate by injecting an ion or the like.

The operation frequency of the first surface acoustic wave module is efficiently changed when the oxide thin film including IV-a elements is 0.001–0.5$\lambda$ thick (where $\lambda$ is the wavelength of a surface acoustic wave). The film thickness depends on the geometrical conditions of the SAW element, more specifically, the acoustic velocity of a surface acoustic wave. The thickness is preferably 0.001–0.05$\lambda$ (where $\lambda$ is the same as the spatial cycle $\lambda$ of electrodes), more preferably, 0.002–0.03$\lambda$.

It is preferable for the first surface acoustic wave module if the substrate is at least one piezoelectric substrate selected from the group consisting of quartz, $LiTaO_3$, $LiNbO_3$, $Li_2B_4O_7$, ZnO, AlN, $Ta_2O_5$, Pb—Nb—Ti—Mn—In—O and Pb—Zr—Ti—O.

The first method of manufacturing a surface acoustic wave module of the invention includes the steps of forming an oxide thin film on a surface acoustic wave transmitting substrate, of forming electrodes for driving and receiving a surface acoustic wave to the surface of the oxide thin film, otherwise forming electrodes for driving and receiving a surface acoustic wave on a surface acoustic wave transmitting substrate and forming an oxide thin film on the surface of the electrodes, and then conducting packaging and treating so as to change a crystal atom configuration of the thin film. As a result, a SAW module element can be manufactured efficiently.

At least one method selected from the group consisting of a light irradiation method, a heat irradiation method, and an electromagnetic wave irradiation method is applied so as to change the crystal configuration, so that a surface acoustic wave module is efficiently manufactured.

A holder for a surface acoustic wave module element mounting is further attached, and the holder for a surface acoustic wave module element mounting comprises materials which pass at least light, heat rays or electromagnetic waves, so that a surface acoustic wave module is efficiently manufactured.

The crystal atom configuration of the thin film is changed after packaging the surface acoustic wave module, so that a surface acoustic wave module is efficiently manufactured.

The operation frequency of the second surface acoustic wave module becomes variable. By forming the high resistance thin film between the frequency adjusting thin film and the thin film, the substrate surface is protected from operation frequency variable processes, and the second surface acoustic wave module can operate stably.

The second surface acoustic wave module of the invention has lower operation loss and can operate stably if the resistivity of the high resistance thin film is at least $10^3$ $\Omega$cm.

When the high resistance thin film is 1–100 nm thick, the operation of the second surface acoustic wave module becomes stable.

If the high resistance thin film is a compound thin film including at least oxygen, the second surface acoustic wave module operates stably.

The high resistance thin film is a compound thin film including at least nitrogen, so that the second surface acoustic wave module operates stably.

The operation of the second surface acoustic wave module becomes stable if the high resistance thin film is an oxide thin film including at least one oxide selected from the group consisting of titanium (Ti), aluminum (Al), silicon (Si) and lithium (Li).

The high resistance thin film is a nitride thin film including at least one nitride selected from the group consisting of aluminum (Al), silicon (Si) and boron (B), so that the second surface acoustic wave module operates stably.

When the substrate is at least one piezoelectric substrate selected from the group consisting of $LiTaO_3$, $LiNbO_3$ and $Li_2B_4O_7$, the operation of the second surface acoustic module becomes stable.

The operation of the second surface acoustic wave module would be stable if the substrate is at least one piezoelectric substrate selected from $LiTaO_3$, $LiNbO_3$ and $Li_2B_4O_7$.

In the second method of manufacturing a surface acoustic wave module of the invention, the electric potential between the electrodes is fixed the same even if a pyroelectric phenomenon is generated on the substrate during the separation process, thus preventing the electrodes from being broken.

In the third method of manufacturing a surface acoustic wave module of the invention, the electric potential between the electrodes remains the same even if a pyroelectric phenomenon is generated on the substrate during the separation process, thus preventing the electrodes from being broken.

When the metallic film is 1–100 nm thick, a surface acoustic wave module can be efficiently manufactured.

The metallic film is made of a metal or an alloy of metals selected from the group consisting of titanium (Ti), aluminum (Al), silicon (Si), boron (B) and lithium (Li), so that a surface acoustic wave module is efficiently manufactured.

The substrate is at least one piezoelectric substrate selected from the group consisting of $LiTaO_3$, $LiNbO_3$ and $Li_2B_4O_7$, so that a surface acoustic wave module can be more efficiently manufactured.

If the metallic film is treated by an oxdizing treatment or a nitriding treatment so as to increase its resistivity, a surface acoustic wave module can be more efficiently manufactured.

FIG. 1 is a schematic view of a conventional SAW filter. In the figure, a surface acoustic wave is driven by applying an electrode 2 for transmitting the wave which is formed in a comb-shape on the surface of a piezoelectric substrate 1. The surface acoustic wave is detected by an electrode 3 used for receiving the wave. A band pass filter having a radio transmission frequency band with various frequency characteristics can be manufactured by adjusting the spatial frequency λ (or the wavelength of a driven surface acoustic wave) of electrode 2 and electrode 3 on substrate 1, the number of paired electrode-fingers, and the degree of crossing between the electrode-fingers and electric wave. The correlation between the frequency f (operation frequency) and the spatial frequency of the filter is expressed by the formula, $v = \lambda \cdot f$ where v indicates a SAW phase velocity (surface acoustic wave transmission velocity) of substrate 1. In other words, in order to increase the operation frequency, a piezoelectric material with high phase velocity is used for substrate 1, or the spatial frequency of electrode-fingers of electrode 2 and electrode 3 is set small (in other words, the pitch is minimized). Among piezoelectric materials having large phase velocity, quartz crystal is widely used because of its stable availability. The phase velocity of quartz is 3158 m/s, and the frequency band of conventional mobile communication devices is from 100 MHz to 1 GHz. Therefore, the spatial frequency of electrode 2 and electrode 3 is required to be 3–30 μm. Al is generally deposited on the substrate as electrode 2 and electrode 3. The change in operation frequency is dependent on the deposition condition of electrodes 2 and 3 on substrate 1, the thickness of the electrodes, and the processing precision of the electrodes. In a conventional technique, the processing precision of the electrodes is limited to 1%, indicating that the yield of SAW filters operating at preferable frequencies is low. An interdigital transducer having a sub-micron spatial frequency is used when a sub-micron wave band frequency is utilized. However, obtaining a 1% yield is not possible.

Thus, the control and arrangement of acoustic velocity (phase velocity) of a surface acoustic wave generated on the surface of substrate 1 were examined.

The change in phase velocity is caused by the change in temperature and humidity of substrate 1 itself or electrode 2 and electrode 3. However, control over the temperature and humidity is not suitable for controlling and adjusting phase velocity. It is commonly known that the speed of a surface acoustic wave generated at substrate 1 relies on physical constants relating to the orientation of the cut surface of substrate 1, and piezoelectric phenomenon such as Young's modulus, density and Poisson's ratio. A surface acoustic wave transmits at a region of several dozen nm to several hundred nm deep from the surface of substrate 1, so that the transmission velocity of the wave is thought to be changed if the above-noted physical constant around the surface of substrate 1 is varied by a certain method.

Distortion has to be generated by adding tension and compressive stress to the substrate surface so as to change the piezoelectric constant of the substrate surface. The tension and compressive stress are generated by changing the quality of the substrate surface or by adding a material to the substrate surface.

A lattice defect section is formed on a substrate or an impurity is injected into a substrate, so that the quality of one section of the substrate surface is changed. As an experiment of forming a modified section on the substrate surface, a Kaufman type ion source (ion beam) was used and an argon (Ar) ion, a hydrogen (H) ion, an oxygen (O) ion and a helium (H) ion were irradiated to the surface of the SAW filter. Before and after the irradiation of ions, the operation frequency of the filter was measured. According to the result, the operation frequency varies due to the irradiation. This is because a lattice defect layer or a crystal rearrangement layer is formed on the surface of substrate 1 by the ion irradiation, so that a thin layer having a different crystal configuration, density and a piezoelectric constant from those of substrate 1 is formed on substrate 1. Therefore, the transmission velocity of a surface acoustic wave driven by electrode 2 changes before and after the formation of the thin film.

It was also found that the operation frequency of the SAW filter changes if a small quantity of metallic atoms was injected to the surface of substrate 1 by applying a large ion beam.

However, the above-noted method of changing the quality of a substrate surface by applying an ion beam has a problem in that electrode 2 and electrode 3 are etched at the same time even though the method can adjust the operation frequency of a SAW filter.

The change in transmission velocity of surface acoustic wave by forming a thin film on substrate 1 was also examined.

The frequencies of a SAW can be changed by depositing a Si—O film having a mismatching lattice configuration. This method is disclosed in Published examined (Tokkohei) Japanese Patent Application No. Hei 3-51128. However, for a SAW having Si—O film deposited thereon, the operation frequency further changed in other tests like temperature flow test at about 300° C. The test was conducted after the manufacturing step. And in the range of ordinary use of the element, the change of the frequency was as much as several dozen ppm/° C.

In addition, the optical properties of Si—O thin films are different due to the film depositing methods including sputtering method, laser aberration method and electron beam deposition method. And the light source irradiated to the Si—O film is limited to a low-pressure mercury lamp with the wavelength of 200 nm or less.

In order to solve such problems, material which is stabilized after heat treatment or light beam treatment was needed.

After some examinations, it was found that a SAW that includes an oxide of group IV-a elements like Ti and Zr realizes more variable frequencies compared to the SAW of Published examined (Tokkohei) Japanese Patent Application No. Hei 3-51128. And it is stable against the change of temperature. The result will be explained by referring to the following examples. The test results are specifically explained by referring to the following examples.

EXAMPLE 1

Figure 2:
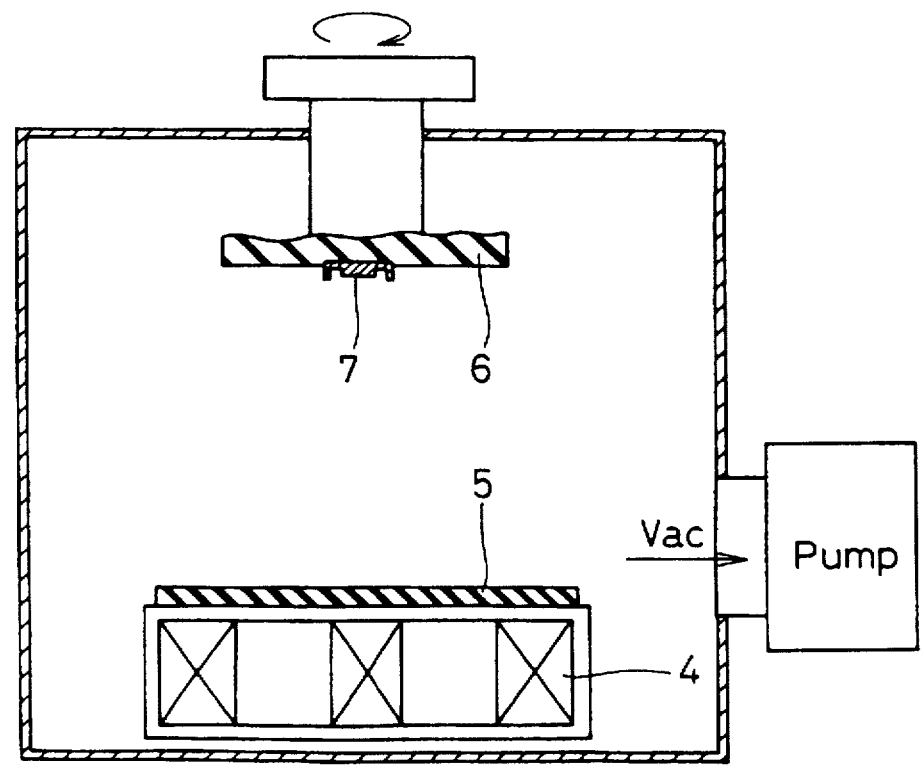
FIG. 2 is a schematic view of a high frequency magnetron sputtering device used for accumulating a thin film of a first embodiment of the invention.
Figure 3A:
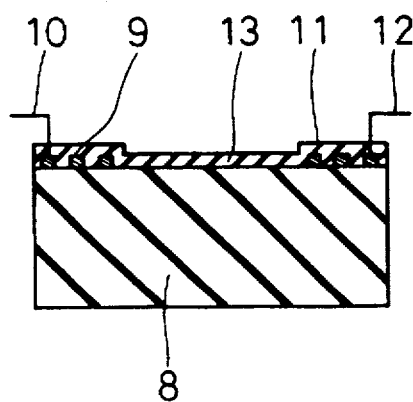
FIGS. 3A and 3B are cross-sectional views of a surface acoustic wave filter of the first embodiment and a second embodiment of the invention.
Figure 3B:
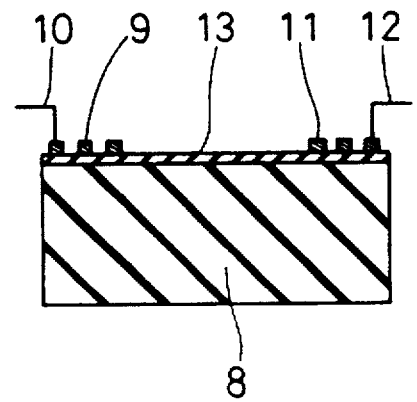
Figure 8:
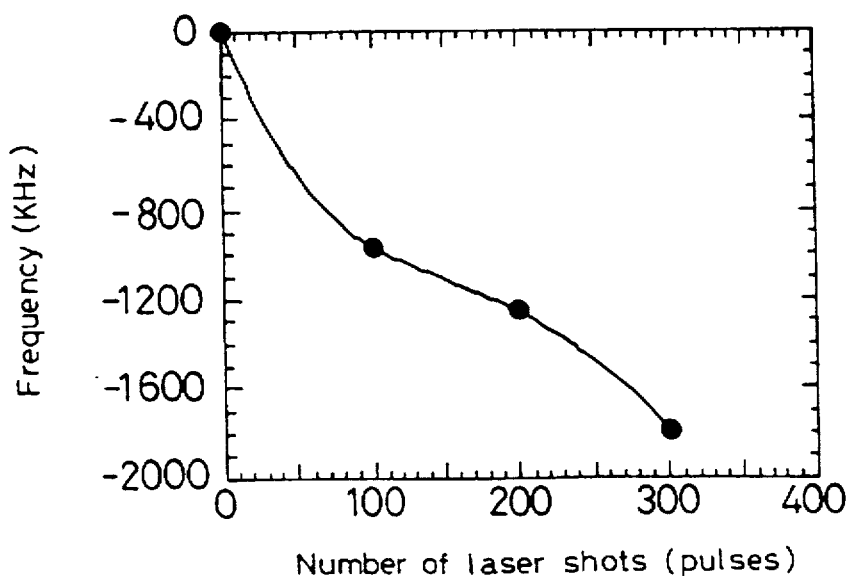
FIG. 8 is a graph showing the correlation between the number of laser beam shots and the operation frequencies of a surface acoustic wave filter of the third embodiment of the invention.

A SAW filter of 315 MHz frequency including a quartz crystal surface acoustic wave generating and transmitting substrate was used as a sample. On the quartz substrate, a thin Ti—O film was deposited by a high frequency magnetron sputtering method. A high frequency magnetron sputtering device used for the method is shown in FIG. 2. A disc target 5, which was a molded and baked Ti—O ceramic, was deposited on a magnetron cathode 4, and 13.56 MHz high frequency electric power was introduced so as to sputter target 5, thus forming a Ti—O thin film (containing $TiO_2$ as a main component) on a SAW filter 7 placed on a substrate holder 6. Argon (Ar) of 1 Pa was used as sputtering gas, and the high frequency electric power was 30 W. SAW filter 7 was not heated. The Ti—O thin film was formed at a rate of 1 nm/minute. For example, a 20 nm thick thin film can be formed after 20 minutes of treatment. FIGS. 3A and 3B show schematic views of the SAW filter after the formation of Ti—O thin film. In FIGS. 3A and 3B, 8 is a quartz substrate, 9 is an inter-digital transducer for transmitting a surface acoustic wave, 11 is an inter-digital transducer for receiving the wave, 10 is a lead wire for introducing high frequency electric power, 12 is a lead wire for outletting the high frequency electric power, and 13 is a Ti—O thin film. In FIG. 3A, Al electrodes 9 and 11 are formed on the surface of crystal substrate 8, and lead wires 10 and 12 are connected to electrodes 9 and 11 respectively. Ti—O thin film 13 is formed on the surface of the substrate. In FIG. 3B, Al electrodes 9 and 11 are formed after Ti—O thin film 13 is formed on crystal substrate 8, and lead wires 10 and 12 are then connected.

Figure 4:
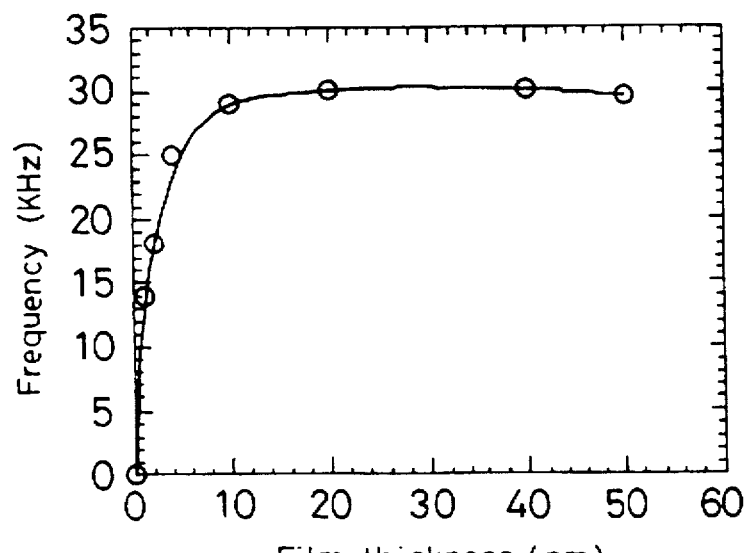
FIG. 4 is a graph showing the correlation between the film thickness of a Ti—O thin film and the operation frequencies of the surface acoustic wave filter of the first embodiment of the invention.

The operation frequency of the SAW filter shown in FIG. 3A was measured. A resonator was prepared by combining the filter with an amplifier in order to measure the resonance frequency by a frequency measuring device. FIG. 4 shows the correlation between resonance frequencies and the thickness of Ti—O thin film 13. According to the figure, it was found that the frequencies change as the thickness of the thin film increases. A surface acoustic wave transmits through substrate 8 as well as Ti—O thin film 13. However, the piezoelectric constant of Ti—O thin film 13 is different from that of substrate 8, so that the transmission velocity of a surface acoustic wave at the thin film differs from that at the substrate. Thus, the speed of the surface acoustic wave from electrode 9 to electrode 11 in the thin film is not the same as that in the substrate, and the operation frequencies are influenced by the accumulation of the thin film. The transmission loss of SAW filter increases gradually as Ti—O thin film 13 is accumulated on substrate 8. However, as long as the thickness of the Ti—O thin film 13 is 0.03λ or less, the transmission loss is 1 dB or less, the change of frequency to temperature is several ppm/° C. or less, and there is no practical problem.

If any thin film having a different crystal configuration from that of substrate 8 is applied as thin film 13, the frequencies would change as in this example. More specifically, the effects of this invention are provided when substrate 8 is a crystal substrate and thin film 13 is a microcrystal thin film including a crystal section or an amorphous thin film including a crystal section (polycrystal thin film including a crystal section). The effects also are found when elements constituting thin film 13 or an element ratio of the film differ from those of substrate 8. If thin film 13 is an insulator, the operation loss of the SAW filter is small.

The frequencies also change when a SAW filter is used which includes a piezoelectric thin film such as ZnO, AlN, $Ta_2O_5$, Pb—Nb—Ti—Mn—In—O and Pb—Zr—Ti—O accumulated on a piezoelectric monocrystal substrate such as $LiTaO_3$, $LiNbO_3$ and $Li_2B_4O_7$.

Besides Ti—O, Zr—O can be used as thin film 13. The thin film can be an oxide or nitride such as Sr—Ti—O, Ca—Ti—O, Ba—Ti—O, Bi—O, Ti—O, Pb—O, Si—O, Mn—O, Al—O, Nb—O, Ta—O, Zr—O, Li—O, B—N, Si—N, Al—N and Zr—N, a multi-compound which is a combination of these oxides and nitrides, a polymer material such as polyimide fluoride, a monomolecular film composed of polymerized monomer molecules, or a laminated film of the monomolecular films.

Thin film 13 may cover the entire surface of substrate 8 or may be discontinuously formed on the substrate.

EXAMPLE 2

According to experiments, it was found that the operation frequencies of the SAW filter of Example 1 change according to the irradiation of light. The experiments are explained below.

Figure 5:
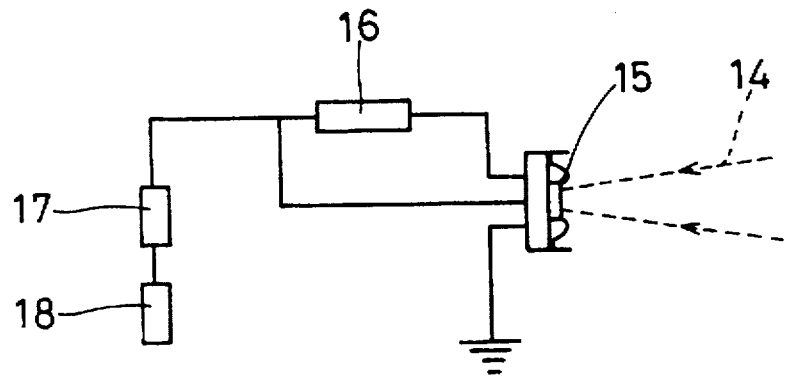
FIG. 5 is a diagram showing the method of measuring the operation frequencies of the surface acoustic wave filter of the second embodiment of the invention.
Figure 6:
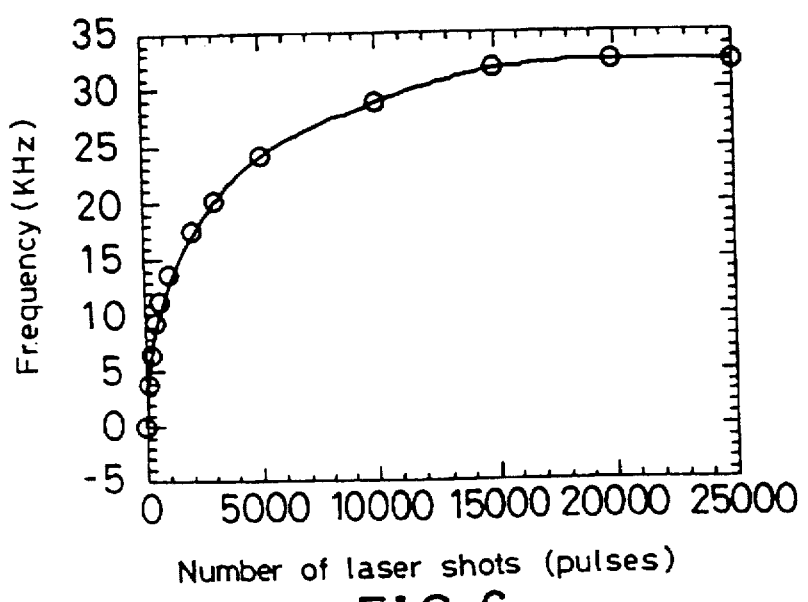
FIG. 6 is a graph showing the correlation between the operation frequencies of a surface acoustic wave filter and the number of laser beam shots of the second embodiment of the invention.

As in Example 1, a SAW filter of 315 MHz was used as a sample. As a light source, krypton fluoride (KrF) eximer laser having a 248 nm wavelength was used. FIG. 5 shows a system for measuring the operation frequencies of a SAW filter. In this example, laser pulse beam 14 of 60 mJ was converged so as to irradiate the surface of the substrate of SAW filter 15 at 10 Hz. The power density of the laser was 1.2 $mW/mm^2$ per pulse. A resonator was prepared by combining the filter with an amplifier 16 in order to measure the operation frequencies, and the frequencies of a resonating acoustic wave were measured by a frequency measuring device 18. FIG. 6 shows the correlation between the shot number of the laser pulse beam and the operation frequencies of the SAW filter. According to the figure, the operation frequencies change as ultraviolet rays are irradiated to the surface of the substrate. It is also found that the transmission loss of the SAW filter improves by about 1 dB. These results are found because the quality of the surface of the quartz substrate is changed by the irradiation of laser pulse beam 14 and a section having a different surface acoustic wave transmission velocity from that of quartz is formed on the quartz substrate. The increase in adherence of heated Al electrodes to the substrate also provided these results. The same effects are found when the wavelength of the irradiated beam is 120 nm or longer. The operation frequencies of SAW filters can be arranged by irradiating an energy beam such as ultraviolet rays, infrared rays and other electromagnetic waves.

The same effects were also provided when a SAW filter was used which includes a Pb type piezoelectric thin film such as ZnO, AlN, $Ta_2O_5$, Pb—Nb—Ti—Mn—In—O and Pb—Zr—Ti—O accumulated on a piezoelectric monocrystal substrate such as $LiTaO_3$, $LiNbO_3$ and $Li_2B_4O_7$.

Even though the SAW filter of 315 MHz was applied in this example, a SAW filter of another operational frequency band can also be applied.

The irradiation of the energy beam is not limited to the entire surface of the surface acoustic wave transmitting substrate or the entire surface of SAW filter including the electrodes. The energy beam can be irradiated to one section of the substrate.

In this example, the transmission velocity of the surface acoustic wave changes without being dependent on the materials of the electrodes and a surface acoustic wave transmitting section. The same effects also were found in a surface acoustic wave module including not only a SAW filter but also an oscillator, a resonator and a delay device.

EXAMPLE 3

Since titanium oxide can have various crystal structures such as TiO, $Ti_2O_3$ and $TiO_2$ (rutile or anatase), physical constants relating to the piezoelectric properties of a Ti—O thin film and the transmission velocity of a surface acoustic wave vary in a wide range by changing the crystal configuration of the Ti—O thin film. In order to improve Examples 1 and 2, a thin film was formed on the surface acoustic wave transmitting substrate so as to change the crystal configuration of the thin film.

Figure 7:
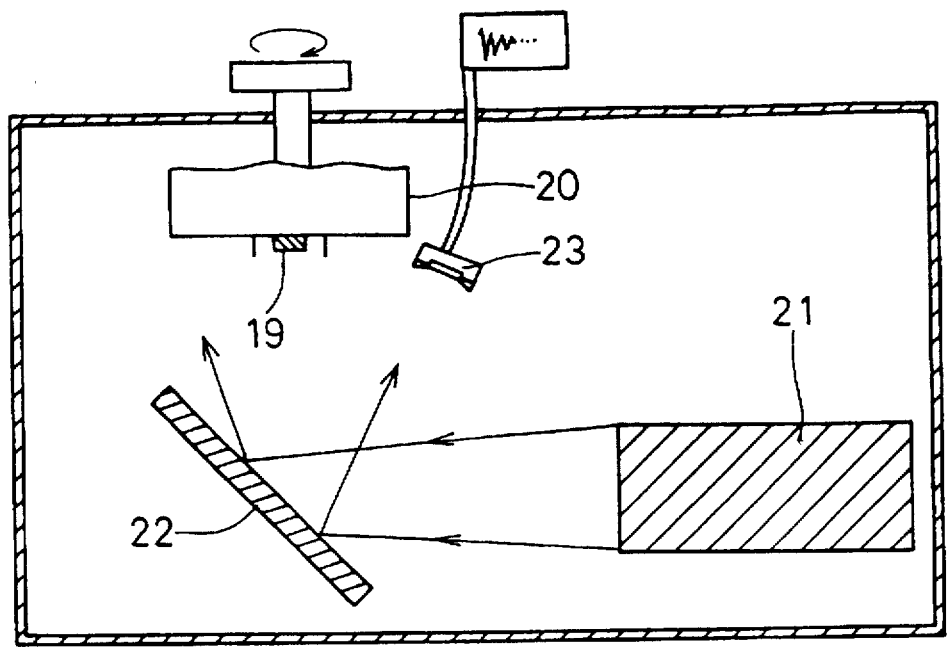
FIG. 7 is a schematic view of an ion beam sputtering system of a third embodiment of the invention.

As in Examples 1 and 2, a SAW filter of 315 MHz was used as a sample. On a surface acoustic wave transmitting piezoelectric substrate, a Ti—O thin film was accumulated by an ion beam sputtering method. The ion beam sputtering method does a fine job of controlling the thickness of a film. As in Example 1, a SAW filter shown in FIG. 3 was manufactured. FIG. 7 is a schematic view of an ion beam sputtering system applied for accumulating a thin film 13 of this example. The system includes a SAW filter contained in a vacuum container, a substrate holder 20, an ion gun 21, a sputtering target 22, and a quartz oscillation-type film thickness monitor 23. In this example, a Kaufman type ion gun having 30 mm mouth diameter (manufactured by Commonwealth Co. in the U.S.) was applied as an ion gun 21. A Ti—O ceramic disc having 75 mm diameter which was baked after being molded was used as a target 22. Argon gas of 1.55 CCM was introduced to ion gun 21, and sputtering was carried out at 500V acceleration voltage. The accumulation speed of Ti—O thin film 13 (containing $TiO_2$ as a main component) on substrate 8 was precisely monitored by film thickness monitor 23 at 0.01 nm/second. The accumulation speed in this example was 0.2 nm/minute. In this speed, a 20 nm thick Ti—O film was formed after a 110 minute long sputtering treatment.

The operation frequencies of the SAW filter were measured by applying the system shown in FIG. 5 as Ti—O thin film 13 on substrate 8 was irradiated with ultraviolet rays. FIG. 8 shows the correlation between the shot numbers of a laser pulse beam irradiated to Ti—O thin film 13 and the operation frequencies of the SAW filter when the thickness of the thin film is 20 nm. According to FIG. 8, the operation frequencies of the SAW filter change radically by the irradiation of ultraviolet rays to Ti—O thin film 13.

A similar effect was obtained by using Zr—O film. A Zr—O film permitted more variable frequency, namely 5–10 times compared to Si—O film (see No. Hei 3-51128). And the frequency change to temperature change was extremely stable, namely, several ppm/° C.

It was also found that the operation frequencies of the SAW filter changed by the irradiation of ultraviolet rays when the thickness of Ti—O thin film 13 was 1 nm or more. The transmission loss of the filter increases gradually as Ti—O thin film 13 is accumulated on substrate 8. However, as long as the thickness of Ti—O thin film 13 is 0.03 λ or less, the transmission loss is 1 dB or less and there is practically no problem.

Energy rays such as heat rays and electromagnetic waves can also be applied so as to change the operation frequencies of the SAW filter.

Thin film 13 accumulated on substrate 8 and the wavelength of light, heat rays and electromagnetic waves were examined. According to the results, the same effects were found as long as light, heat rays and electromagnetic rays were optically or electromagnetically absorbed by thin film 13. In other words, when rays have a shorter wavelength than the wavelength of band gap energy of the thin film material, the energy of rays is completely absorbed by thin film 13. Thus, the crystal constitution of thin film 13 can be effectively changed. If thin film 13 does not have a mirror surface but instead a rough surface with concave and convex forms, electromagnetic wave energy was not reflected but absorbed by the thin film, thus changing the crystal conditions of thin film 13.

X rays, electron beams and light were used to discover the phenomenon occurring in thin film 13 when energy beams such as light, heat rays and electromagnetic waves were irradiated to the thin film. According to the X-ray photo spectroscopy (XPS), it was found that the crystal condition of Ti—O thin film 13 became close to $TiO_2$ (rutile) condition by the irradiation. In spectrometry and a transmittance measurement, the position of a band gap showing the light absorption edge of Ti—O thin film 13 approached the mono-crystal of $TiO_2$ (rutile) at 420 nm from a short wavelength side, and became steep. Based on the transmission electron microscope (TEM) observation using electron wires, it was found that a crystallized section of Ti—O thin film 13 grew. After examining the electron beam diffraction pattern of Ti—O thin film 13, a spot image showing crystallization was observed from Ti—O thin film 13. These examinations and analyses showed that the crystallization inside Ti—O thin film 13 proceeds by the irradiation of light, heat rays and electromagnetic waves to an amorphous Ti—O thin film 13. In other words, it was found that the change in crystallization of Ti—O thin film 13 would contribute to the change in operation frequencies of the SAW filter. Thus, simply by accumulating thin film 13 on substrate 8 as shown in Example 1, the operation frequencies of the SAW filter change. Atoms and molecules constituting thin film 13 are excited by the irradiation of energy beams such as light, heat rays and electromagnetic waves, so that the thin film changes from an amorphous condition to a crystal condition (including a polycrystal condition), depending on the level of irradiated energy. Due to the shift from a monocrystal condition to a polycrystal condition, the transmission velocity of surface acoustic wave in thin film 13 as well as at the SAW filter changes, thus varying the operation frequencies. As shown in FIG. 8, the change in crystal configuration in thin film 13 is most effective to vary the operation frequencies of the SAW filter.

When thin film 13 was an insulator, the operation loss of the SAW filter was low.

The operation frequencies of the SAW filter were changed when thin film 13 covered the entire surface of substrate 8 or was formed on the substrate surface discontinuously.

Even if the elements constituting thin film 13 or the element ratio of the thin film are either the same or different from those of substrate 8, the operation frequencies of the SAW filter change as long as the crystal configuration and condition or the element ratio of thin film 13 vary by the irradiation of energy beams such as light, heat rays and electromagnetic waves on thin film 13.

The frequencies of a surface acoustic wave change when a SAW filter is applied which includes a piezoelectric thin film made of a Pb type piezoelectric material such as ZnO, AlN,f $Ta_2O_5$, Pb—Nd—Ti—Mn—In—O and Pb—Zr—Ti—O accumulated on a piezoelectric monocrystal substrate such as $LiTaO_3$, $LiNbO_3$ and $Li_2B_4O_7$.

Besides Ti—O, Zr—O can be applied as thin film 13. The thin film can be an oxide or nitride such as Sr—Ti—O, Ca—Ti—O, Ba—Ti—O, Bi—O, Tl—O, Pb—O, Si—O, Mn—O, Al—O, Nb—O, Ta—O, Zr—O, Li—O, B—N, Si—N, Al—N and Zr—N, a multi-compound which is a combination of these oxides and nitrides, a polymer material such as polyimide fluoride, a monomolecular film composed of polymerized monomer molecules, or a laminated film of the monomolecular films.

Even though the SAW filter of 315 MHz was used in this example, a SAW filter of another operational frequency band can also be used.

In this example, the transmission velocity of a surface acoustic wave changes without being dependent on the materials of electrodes 9 and 11 and substrate 8. The same effects were also found in a surface acoustic wave module including not only a SAW filter but also an oscillator, a resonator and a delay device.

Further examination and experiments were conducted referring to the practical steps of manufacturing SAW elements in order to obtain the results shown in the Examples 1–3 more efficiently. And it was confirmed that the operation frequencies could be adjusted in the final step of manufacturing the elements, and the yield was drastically improved, as shown in the following examples.

EXAMPLE 4

The method of manufacturing a preferable module is explained below. FIGS. 9A, 9B, 9C, 9D and 9E show the manufacturing processes of a standard conventional SAW filter. The surface of a crystal was abraded and washed, and a 3 mm wide, 2 mm long and 0.3 mm thick quartz substrate 31 was prepared. Then, a 1 μm thick thin film 32 was formed on the surface of crystal substrate 31, thus forming an Al electrode (FIG. 9A)n By etching the thin film, an electrode 33 for transmitting and receiving a surface acoustic wave was formed on the substrate (FIG. 9B). The substrate was then fixed inside a ceramic holder 34 (FIG. 9C). A leading wire 35 for introducing and outletting high frequency electric power was connected to an outside leading wire 37 (FIG. 9D). As a final step, a sealing window 36 was formed by using a transparent material such as quartz, thus packaging the filter (FIG. 9E). After testing the properties of the module such as the frequencies, transmission loss and temperature stability, the module is then shipped.

However, the properties of the modules, especially the operation frequencies, changed after the step shown in FIG. 9E, and thus the manufacturing yield was deteriorated. The change of temperature while welding the sealing window and/ or the difference of atmospheric pressure inside the package seems to be the cause.

Actually, the operation frequencies of the modules changes according to the step of mounting a sealing window without regularity. The frequencies are greatly affected by the temperature or the humidity of the atmosphere, and the frequencies change 110 ppm at the most. The difference is a serious problem since the accuracy of operation frequencies of the modules should be controlled to be about several dozen kHz.

Figure 9A:
FIGS. 9A, 9B, 9C, 9D and 9E are schematic views of a surface acoustic wave filter of a fourth embodiment of the invention, showing the manufacturing processes of the filter.
Figure 9B:
Figure 9C:
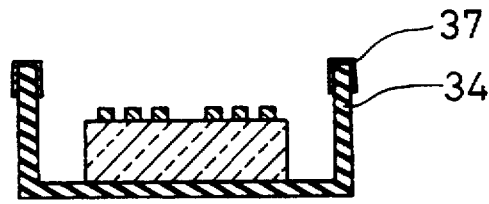
Figure 9D:
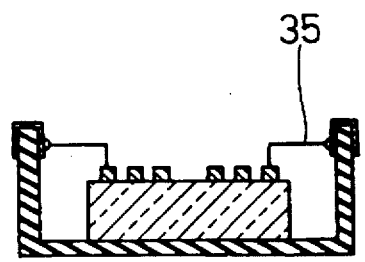
Figure 9E:
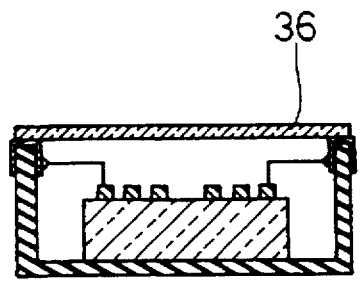

In this example, a thin film for varying the transmission velocity of a surface acoustic wave was formed between the step shown in FIG. 9A and the step shown in FIG. 9E, or before or after the step shown in FIG. 9A.

Figure 10A:
FIGS. 10A, 10B, 10C, 10D, 10E, 10F and 10G are schematic views of a surface acoustic wave filter of the fourth embodiment of the invention, showing the manufacturing processes of the filter.
Figure 10B:
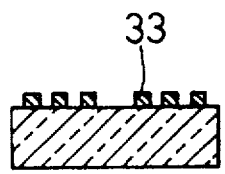
Figure 10C:
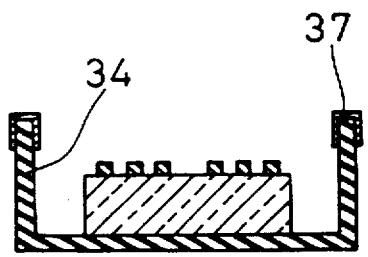
Figure 10D:
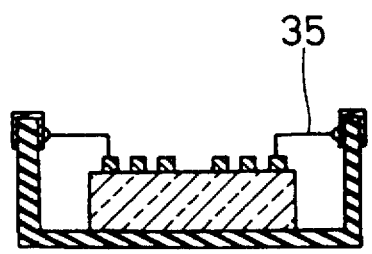
Figure 10E:
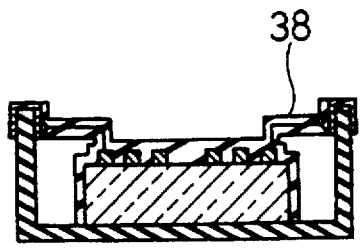
Figure 10F:
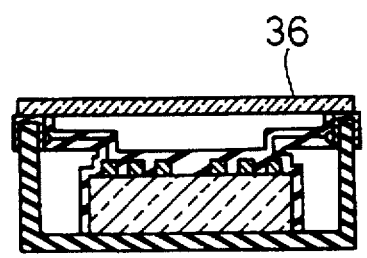
Figure 10G:
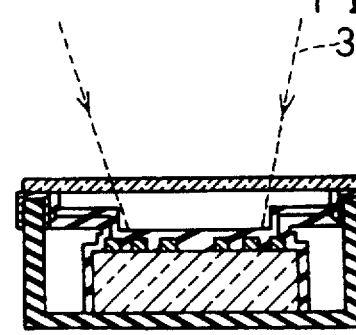

For instance, as shown in FIGS. 10A, 10B, 10C, 10D, 10E, 10F and 10G, a thin film 32 used for an Al electrode was formed on the surface of a quartz crystal substrate 31 (FIG. 10A). By etching the thin film, an electrode 33 for transmitting and receiving the surface acoustic wave was formed on the substrate (FIG. 10B). Then, the substrate was fixed inside a 5 mm×5 mm ceramic holder (FIG. 10C). A lead wire 35 for introducing and outletting high frequency electric power was connected to an outside leading wire 37 (FIG. 10D). A TiO thin film 38 mentioned in Examples 1, 2 and 3, for example, was formed (FIG. 10E). A sealing window 36 was formed by using a transparent material such as quartz, thus packaging the filter (FIG. 10F). As a last step, the quality of thin film 38 was then changed by irradiating light, heat rays or electromagnetic waves (FIG. 10G). Since thin film 38 is directly formed on the SAW filter mounted on the holder, this manufacturing method is simple. Thin film 38 can be formed by a method using a vacuum device such as an ion beam sputtering method mentioned in Examples 1, 2 and 3. A spin coating method under an atmospheric pressure can also be applied.

Figure 11A:
FIGS. 11A, 11B, 11C, 11D, 11E, 11F and 11G are schematic views of a surface acoustic wave filter of the fourth embodiment of the invention, showing the manufacturing processes of the filter.
Figure 11B:
Figure 11C:
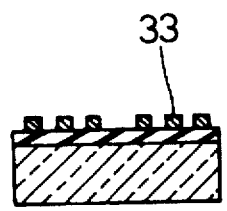
Figure 11D:
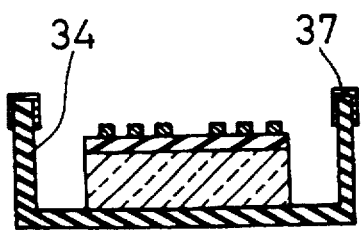
Figure 11E:
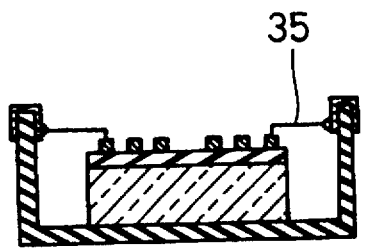
Figure 11F:
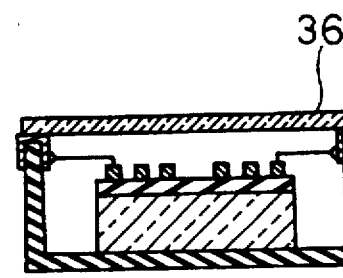
Figure 11G:
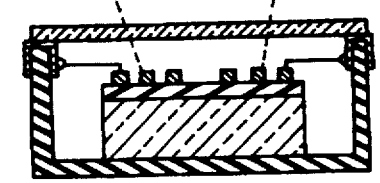

Another example is shown in FIGS. 11A, 11B, 11C, 11D, 11F and 11G. A TiO thin film 40 mentioned in Examples 1 and 3, for instance, was formed on a crystal substrate 31 (FIG. 11A). A thin film 32 used for an Al electrode was formed on the surface of the thin film (FIG. 11B), and was etched so as to form an inter-digital transducer 33 for receiving and transmitting a surface acoustic wave on the substrate (FIG. 11C). The substrate was then fixed inside a ceramic holder 34 (FIG. 11D). A lead wire 35 for introducing and outletting high frequency electric power was connected to an outside leading wire 37 (FIG. 11E). A sealing window 36 was formed by using a transparent material such as quartz, thus packaging the filter (FIG. 11F). As a last step, the quality of thin film 40 was changed by irradiating light, heat rays or electromagnetic waves (FIG. 11G).

In this example, the step of forming a thin film on a substrate can be considered as step "A"; the step of changing the quality of the thin film by applying light, heat rays or electromagnetic waves can be considered as step "B". Step A was conducted after the step shown in FIG. 9D, after the step shown in FIG. 9C, or before the step shown in FIG. 9A. Since the thin film is directly formed on the SAW filter mounted on the holder, conducting step A after the step shown in FIG. 9D is the simplest. The thin film can be formed by an ion beam sputtering method using a vacuum device. A spin coat method under an atmospheric pressure can also be applied. When step A is conducted after the step shown in FIG. 9C, the thin film is formed while a leading wire connecting section on the electrode is masked, or the thin film on the leading wire connecting section has to be etched after forming the thin film on the electrode. A metallic film is deposited after forming the thin film on the substrate and is then etched so as to form an electrode when step A is conducted before the step shown in FIG. 9A.

Step B can be conducted after the step shown in FIG. 9D or the step after FIG. 9E. In any case, the quality of the thin film was changed by irradiating a laser beam so as to provide preferable properties while the electric properties of the SAW filter were measured by a measuring device. If a material which does not transmit light, heat rays or electromagnetic waves is used as the sealing window in the step shown in FIG. 9E, step B is conducted after the step shown in FIG. 9D. However, when a material which transmits light, heat rays or electromagnetic waves such as quartz is used as the sealing window, step B is conducted after the step shown in FIG. 9E.

The frequencies of SAW element also could be adjusted precisely if the glass material like dissolved quartz for the sealing window 36 was replaced with the following materials: sapphire, monocrystal oxide materials like spinel-based materials, transparent materials of monocrystal nitride materials, or metals like iron, copper, brass and aluminum to which the transparent material is attached as the window to pass light, heat rays or electromagnetic waves, or alloy of such metals, ceramics materials, polymer materials like plastics. As the frequencies can be adjusted in the final step of manufacturing the SAW elements, it is possible to adjust the operation frequencies of the element perfectly to be the desired value with the existing electrode-processing accuracy.

The irradiation of light, heat rays and electromagnetic waves for reforming the thin films (38 and 40) was conducted through the sealing window 36 (see FIGS. 10 and 11). The same effect was obtained by irradiating the thin films 38 and 40 through the substrate 31 of the SAW element, if the holder 34 is composed of materials to pass light, heat rays or electromagnetic wave, namely glass materials including dissolved quartz.

The required operation frequencies of a SAW filter are several dozen ppm to several hundred ppm. In this example, however, the operation frequencies of a SAW filter vary over several thousand ppm. The variance of the frequencies depends on the dose of light, heat rays or electromagnetic waves, and the frequencies can be changed while the properties of a SAW filter are measured. Therefore, the methods of this example are simple and highly precise.

In this example, a SAW filter of 315 MHz was used. However, the same effects were provided from a SAW filter having a different operational frequency band region.

The transmission velocity of a surface acoustic wave changes without being dependent on the materials of electrodes 9 and 11 and substrate 8 in this example. The same effects also were found in a surface acoustic wave module including not only a SAW filter but also an oscillator, a resonator and a delay device.

Examples 1, 2, 3 and 4 are effective for arranging the operation frequencies of a SAW module. However, when a material having high piezoelectric and pyroelectric properties such as $LiTaO_3$, $LiNbO_3$ and $Li_2B_4O_7$ is used as a substrate, problems such as the increase in transmission loss and the lag in operation frequencies of the module are found when conducting a high speed treatment with highly strong light, heat rays and electromagnetic waves, or a 200°–300 C. temperature flow test of sharp temperature gradient. These problems are not encountered when using a crystal with relatively weak piezoelectric and pyroelectric properties. The problems are generated depending on the substrate material and the absorption of energy from light, heat rays and electromagnetic waves. Empirical tests were directed so as to stabilize the operation of the SAW module manufactured in Examples 1, 2, 3 and 4. An optical band gap of $LiTaO_3$, $LiNbO_3$ or $Li_2B_4O_7$ is about 3 eV (–400 nm), and light of 28 nm applied in Examples 2, 3 and 4 is completely absorbed by the substrate. On the other hand, the band gap of a crystal is about 10 eV (–120 nm), and light of 248 nm is not absorbed by the substrate and is transmitted. Therefore, the energy of light, which is not completely absorbed by thin film 13, is absorbed by $LiTaO_3$, $LiNbO_3$ or $Li_2B_4O_7$ (substrate 8). The absorbed energy concentrates mainly in a thin boundary between thin film 13 and substrate 8, and distortion is generated due to a pyroelectric effect. This distortion mechanically deteriorates the surface of substrate 8 and the boundaries between thin film 13 and electrodes 9 and 11, thus providing the above-mentioned problems. Therefore, an extremely thin film with high resistivity was formed on substrate 8, and thin film 13 mentioned in Examples 1, 2, 3 and 4 was then formed on the extremely thin film so as to adjust the operation frequencies of the module. As a result, the problems mentioned above were solved.

EXAMPLE 5

A SAW filter of 900 MHz was used as a sample in this example. FIGS. 12A and 12B show cross-sectional views of the SAW filter of this example. In the figures, 41 indicates a 0.3 mm thick 36° Y-X cut $LiTaO_3$ monocrystal substrate, 42 is an inter-digital transducer for transmitting the surface acoustic wave, 44 is an inter-digital transducer for receiving the wave, 43 is a lead wire for introducing high frequency electric power, 45 is a lead wire for outletting high frequency electric power, 47 is a Si—O thin film, and 46 is a TiO thin film for adjusting frequencies. In FIG. 12A, Al electrodes 42 and 44 are formed after forming high resistant Si—O thin film 47 on the surface of $LiTaO_3$ substrate, and lead wires 43 and 45 are connected to electrodes 42 and 44 respectively. Ti—O thin film 46 is then formed on the substrate. In FIG. 12B, Al electrodes 42 and 44 are formed on $LiTaO_3$ substrate 42, and lead wires 43 and 45 are connected to electrodes 42 and 44 respectively after forming highly resistant Si—O thin film 47. Ti—O thin film 46 is then formed on the substrate. In both structures shown in FIGS. 12A and 12B, thin film 46 functions to change the operation frequencies of the SAW filter. In other words, as in Example 3, a 20 nm thick Ti—O film was formed by an ion beam sputtering method as thin film 46, and a krypton fluoride eximer laser pulse beam having 248 nm wavelength was irradiated while the operation frequencies of the SAW filter were measured. As in FIG. 8, the operation frequencies of the SAW filter changed by about 5 MHz with 300 shots of laser pulse beam.

A temperature stability test was directed to the SAW filter in a nitrogen atmosphere at 300° C. The operation frequencies of the SAW filter were ½ or less of the frequencies of a SAW filter having no highly resistant Si—O thin film 47 between Ti—O thin film 46 and substrate 41. The transmission loss of the SAW filter was also less than that of a SAW filter having no highly resistant Si—O thin film 47 between Ti—O thin film 46 and substrate 41 by 0.5 dB. These positive results are provided since the substrate surface is protected from various operation frequency variable processes by forming highly resistant thin film 47 between thin film 46 and substrate 41, thus stabilizing the operation of the SAW filter.

In this example, the operation of a surface acoustic wave module becomes stable if thin film 47 is a compound thin film including at least oxygen or nitrogen.

It was found that the operation loss of the surface acoustic wave module declined when thin film 47 was a high resistance thin film having $10^3$ Ωcm or more resistivity, thus stabilizing the operation of the module.

When the resistivity of thin film 47 was higher than that of thin film 46, the operation loss of the surface acoustic module decreased, so that the module operated stably.

The operation of the surface acoustic wave module became stable when thin film 47 was a Si—O thin film or an oxide thin film further including a material selected from the group consisting of group IVb atoms, group IIIb atoms, group Va atoms, group IIIa atoms, group IVa atoms, and a Li oxide.

If thin film 47 is a Si—O thin film or a nitride thin film made of the nitride of group IIIa atoms or group IVa atoms, the operation of the surface acoustic wave module becomes stable.

The operation of the module became stable when the thickness of thin film 47 was from 1 nm to 100 nm.

Besides Ti—O, thin film 46 can be an oxide or nitride such as Zr—O, Sr—Ti—O, Ca—Ti—O, Ba—Ti—O, Bi—O, Tl—O, Pb—O, Si—O, Mn—O, Al—O, Nb—O, Ta—O, Zr—O, Li—O, B—N, Si—N, Al—N and Zr—N, a polymer compound which is a combination of these oxides and nitrides, a polymer material such as polyimide fluoride, a monomolecular film composed of polymerized monomer molecules or a laminated film of the monomolecular films.

The SAW filter of 900 MHz was used in this example, but the same effects were provided from a SAW filter with a different operation frequency band region.

In this example, the same effects were also found in a surface acoustic wave module including not only a SAW filter but also an oscillator, a resonator and a delay device.

Even when $LiNbO_3$ or $Li_2B_4O_7$ was used as substrate 41, the same effects were obtained.

When several hundred SAW modules are manufactured from a sheet substrate, heat is locally generated on a piezoelectric substrate during a separation process, carried out after the formation of electrodes. Then, the difference in electric potential generates between the electrodes because of the pyroelectric properties of the substrate, so that the electrodes are broken by the electric arc generated between them. This problem is found especially when a material having strong piezoelectric properties such as $LiTaO_3$, $LiNbO_3$ and $Li_2B_4O_7$ is used as a substrate. In a high frequency SAW module of 1 GHz or higher having a narrow gap between electrodes, the electric field generated between the electrodes is strong. Thus, experiments were carried out to remove the generation of the electric arc, such as by setting the electric potential of each electrode the same during a separation process and by forming a conductive thin film along a gap between the electrodes.

If a conductive thin film is formed after forming the electrodes on a sheet, the breakage of the electrodes caused by the pyroelectric properties of the substrate during a separation process is avoided by removing the conductive thin film. However, the breakage of the electrodes can be prevented simply by increasing the resistivity of the conductive thin film after forming that thin film, forming the electrodes on the thin film and separating the sheet, or by raising the resistivity of the conductive thin film after forming the electrodes on the sheet, forming the conductive thin film and then separating the sheet. A thin film used for controlling operation frequencies mentioned in Examples 1, 2, 3 and 4 may be formed on a SAW module prepared by increasing the resistivity of the conductive thin film to avoid the breakage, so that the surface of the substrate is protected from frequency adjustment processes and the operation of the module becomes stable.

Methods of increasing the resistivity of the conductive thin film include (i) a method of injecting impurities into the thin film made of a semiconductor or removing impurities, and (ii) a method of oxdizing and nitriding the thin film made of a metal or an alloy. However, in the method (i), a SAW module has to be heated to 300° C. or higher in order to activate the semiconductor thin film, and a plasma treatment is required for the injection of impurities. A long heat treatment in a vacuum or reduction condition is also required for removing impurities, thus deteriorating the substrate surface and the electrodes. On the other hand, in the method (ii), an oxidizing or nitriding treatment is simply carried out after separating the sheet as long as a metal or an alloy is chosen which can be easily oxidized or nitrided. Moreover, since a metal has higher carrier density than a semiconductor or a compound conductive material, the metallic film can be formed extremely thin. The extremely thin conductive film made of a metal or an alloy can provide both conductivity and high resistivity.

EXAMPLE 6

A method of manufacturing a SAW filter is shown in FIGS. 13A, 13B, 13C, 13D, 13E, 13F and 13G. As a sheet 48, a 0.3 mm thick 36° Y-X cut $LiTaO_3$ monocrystal having 75 mm diameter was used for manufacturing a SAW filter of 900 MHz in this example. The surface of sheet 48 was abraded to provide a mirror surface, was washed, and was then formed with a Si thin film 49 by an ion beam sputtering method (FIG. 13A). In the ion beam sputtering system shown in FIG. 7, a Si metallic disc of 75 mm diameter was used as a target 22. For the sputtering, 2.00 SCCM argon gas was introduced to an ion gun 21. The sputtering was carried out at 1 kV acceleration voltage. The accumulation speed of Si thin film 49 on sheet 48 was 0.3 nm/minute. A 3 nm thick Si thin film 49 was provided after a 10 minute long sputtering treatment. Then, a 800 nm thick Al thin film 50 used for an electrode was formed on Si thin film 49 (FIG. 13B). Al thin film 50 was etched to form an inter-digital transducer 51 for transmitting and receiving a surface acoustic wave (FIG. 13D). Sheet 48 was separated by a precision cutter (FIG. 13E). A lead wire 54 for introducing and outletting high frequency electric power was connected to an outside leading wire 54 (FIG. 13F). A step of increasing the resistivity of Si thin film 49 is shown in FIG. 13G. In this example, Si thin film 49 was oxidized by an oxidizing treatment, thus forming a Si—O film 55. In the oxidizing treatment, a SAW filter sample placed on a ceramic holder 52 was heated to 100° C. in an oxygen atmosphere for ten minutes. The electric properties of the SAW filter were tested. In a conventional method of manufacturing a SAW filter, a step of accumulating thin film 49 shown in FIG. 13A is not carried out, and a good deal of electric arc is generated on electrode 51 during a separation process shown in FIG. 13D. However, in the manufacturing method of this example, the electric arc was not generated. The electric properties of 100 SAW filters of this example were compared with those of 100 conventional SAW filters, and the results are shown in the following Table 1.

TABLE 1

| Manufacturing method | Normal operation Sample number | Substandard operation Sample number |
| --- | --- | --- |
| Conventional method | 38 | 62 |
| Method of the example | 100 | 0 |

In the conventional method, about 60% of SAW filters could not be used since a gap between the electrodes was shunted. On the other hand, it was possible to use 100% of the SAW filters of this example. The test proved that the effect of pyroelectricity generated on sheet 48 during a separation process shown in FIG. 13D was eliminated in this example. The resistivity of Si—O film 55 is required to be high at $10^3$ Ωcm or higher. It also was confirmed that the transmission loss of a SAW filter would be beyond the practical level of 3 dB if the resistivity of the Si—O film 55 were less than $10^3$ Ωcm due to the insufficient oxidization of Si thin film 49.

The effects of this example can be provided as long as the step shown in FIG. 13G is conducted after the separation step shown in FIG. 13D.

When the thickness of metallic thin film 49 was from 1 nm to 100 nm, the effects of this example were found. However, the operation frequencies of the SAW filter only change by several dozen kHz. Therefore, the frequency adjustment mentioned in Examples 1, 2, 3 and 4 can be carried out in this example so as to change the operation frequencies as mentioned in those examples.

Besides Si, a metal or an alloy of metals selected from the group consisting of Ti, Al, boron (B) and Li can be used for metallic film 49 so as to provide the same effects of this example.

It was also confirmed that the resistivity of metallic film 49 was increased not only by an oxidizing treatment but also by a nitriding treatment, thus providing the effects of this example.

Even though a SAW filter of 900 MHz was applied in this example, a SAW filter having a different operation frequency band region can be applied to provide the same effects of this example.

The same effects of this example were also found in a surface acoustic wave module including not only a SAW filter but also an oscillator, a resonator and a delay device.

In addition to $LiTaO_3$, $LiNbO_3$ or $Li_2B_4O_7$ can be applied as substrate 48 to provide the same effects of this example.

EXAMPLE 7

In Example 6, electrode 51 was formed on 1–100 nm thick metallic film 49, and 800 nm thick Al thin film 50 has to be etched without scraping off metallic film 49. Thus, in this example, metallic film 49 is formed after forming electrode 51 without being influenced by the pyroelectric effect during the separation process.

FIGS. 14A, 14B, 14C, 14D, 14E, 14F and 14G show the method of manufacturing a SAW filter of this example. As in Example 6, a 0.3 mm thick 36° Y-X cut $LiTaO_3$ monocrystal of 75 mm diameter was used as a sheet 48 for manufacturing a SAW filter of 900 MHz. The surface of sheet 48 was abraded to provide a mirror surface, was washed, and then was formed with a 800 nm thick thin film 50 used for an Al electrode (FIG. 14A). The thin film was etched to form an inter-digital transducer 51 for transmitting and receiving a surface acoustic wave (FIG. 14B). A Si metallic thin film 49 was then accumulated on sheet 48 by the ion beam sputtering method mentioned in Example 3 (FIG. 14C). In the ion beam sputtering system shown in FIG. 7, a Si metal disc of 75 mm diameter was applied as a target 22. The sputtering was carried out at 1 kV acceleration voltage by introducing argon gas to an ion gun 21. The accumulation speed of Si thin film 49 was 0.3 mm/minute, and a 3 nm thick Si metallic thin film 49 was provided after a 10 minute long sputtering treatment. Then, the sheet was separated to provide individual filters (FIG. 14D). One filter was fixed inside a ceramic holder 52 (FIG. 14E). A lead wire 54 for introducing and outletting the surface acoustic wave was connected to an outside leading wire 54 (FIG. 14F). FIG. 14G shows a step of increasing the resistivity of metallic thin film 49. In this example, an oxidizing treatment was carried out on Si metallic thin film 49, thus oxidizing Si and forming a Si—O film 55. In this oxidizing treatment, a SAW filter sample placed on a ceramic holder 52 was heated to 100° C. in an oxygen atmosphere for ten minutes. The electric properties of the SAW filter were measured. A step of accumulating metallic film 49 shown in FIG. 14A is not carried out in a conventional method of manufacturing a SAW filter, and a good deal of electric arc is generated during the separation process shown in FIG. 14D. However, in this example, the electric arc was not generated. The electric properties of 100 SAW filters of this example were tested as in Example 6, and the test results were the same as the ones shown in Table 1. In this example, 100% of tested SAW filters were good for use, and the effect of pyroelectricity generated on sheet 48 during the separation process was eliminated. The resistivity of Si—O film 55 is required to be high at $10^3$ Ωcm or higher. It was found that the transmission loss of the SAW filter would be above the practical level of 3 dB if the resistivity of Si—O film 55 were lower than $10^3$ Ωcm, due to the insufficient oxidization of Si metallic thin film 49.

When the thickness of metallic thin film 49 was 1–100 nm, the effects of this example were found. With this range of film thickness, the operation frequencies of the SAW filter vary only by about several dozen kHz. However, by carrying out the frequency adjustment described in Examples 1, 2, 3 and 4, the frequencies of the filter can be changed as in those examples.

In addition to Si, a metal or an alloy of metals selected from the group consisting of Ti, Al, boron (B) and Li can be used for metallic thin film 49 to provide the effects of this example.

Besides an oxidizing treatment, a nitriding treatment can also be used to increase the resistivity of metallic thin film 49, thus providing the effects of this example.

Even though the SAW filter of 900 MHz was used in this example, the same effects of the example can be provided with a SAW filter having a different operation frequency band region.

The same effects were also found from a surface acoustic wave module including not only a SAW filter but also an oscillator, a resonator and a delay device.

Not only $LiTaO_3$ but also $LiNbO_3$ or $Li_2B_4O_7$ can be applied as substrate 48 so as to provide the effects of this example.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A surface acoustic wave module comprising electrodes for driving and receiving a surface acoustic wave, a substrate for transmitting said surface acoustic wave, and an oxide thin film comprising one or more group IV-a elements formed on at least one section of a surface of said substrate so as to differentiate a transmission velocity of a surface acoustic wave, wherein the oxide thin film comprising group IV-a group elements is 0.001–0.05λ thick where λ indicates a wavelength of a surface acoustic wave.

2. The surface acoustic wave module of claim 1, wherein the oxide thin film comprising group IV-a elements has a different crystal configuration and different elements from a crystal configuration and elements of the substrate.

3. The surface acoustic wave module of claim 1, wherein the oxide thin film comprising group IV-a elements is at least one thin film selected from the group consisting of a Ti—O thin film and a Zr—O thin film.

4. The surface acoustic wave module of claim 1, wherein the oxide thin film comprising group IV-a elements is accumulated or coated on the substrate.

5. The surface acoustic wave module of claim 1, wherein the substrate is a crystal substrate, and wherein the thin film is at least one thin film selected from the group consisting of a microcrystal thin film comprising a crystal section and an amorphous thin film comprising a crystal section.

6. The surface acoustic wave module of claim 1, wherein the oxide thin film comprising group IV-a elements is an insulator.

7. The surface acoustic wave module of claim 1, wherein the oxide thin film comprising group IV-a elements is formed on one section of the surface of the substrate.

8. The surface acoustic wave module of claim 1, wherein the substrate is at least one piezoelectric substrate selected from the group consisting of crystal, LiTaO$_3$, LiNbO$_3$, Li$_2$B$_4$O$_7$, ZnO, AlN, Ta$_2$O$_5$, Pb—Nb—Ti—Mn—In—O and Pb—Zr—Ti—O.

9. A surface acoustic wave module comprising electrodes for driving and receiving a surface acoustic wave, a substrate for transmitting said surface acoustic wave, and a high resistance thin film on at least one section of said substrate, and a thin film formed on said high resistance thin film so as to differentiate the transmission velocity of a surface acoustic wave at the high resistance thin film from the transmission velocity of a surface acoustic wave at said substrate, wherein the high resistance thin film is 1–100 nm thick.

10. The surface acoustic wave module of claim 9, wherein the high resistance thin film is a compound thin film including at least nitrogen.

11. The surface acoustic wave module of claim 9, wherein the high resistance thin film is an oxide thin film comprising an oxide of at least one element selected from the group consisting of titanium (Ti), aluminum (Al), silicon (Si) and lithium (Li).

12. The surface acoustic wave module of claim 9, wherein the high resistance thin film is a nitride thin film comprising a nitride of aluminum (Al), silicon (Si) or boron (B).

13. The surface acoustic wave module of claim 9, wherein the thin film formed on the high resistance thin film so as to differentiate the transmission velocity is an oxide thin film or a nitride thin film.

14. The surface acoustic wave module of claim 9, wherein the substrate is at least one piezoelectric substrate selected from the group consisting of LiTaO$_3$, LiNbO$_3$, Li$_2$B$_4$O$_7$.

15. The surface acoustic wave module of claim 9, wherein the high resistivity of the high resistance thin film is at least 10$^3$ Ωcm.

16. The surface acoustic wave module of claim 9, wherein the high resistance thin film is a compound thin film including at least oxygen.

* * * * *